(12) United States Patent
Hshieh

(10) Patent No.: US 6,426,260 B1
(45) Date of Patent: Jul. 30, 2002

(54) SWITCHING SPEED IMPROVEMENT IN DMO BY IMPLANTING LIGHTLY DOPED REGION UNDER GATE

(75) Inventor: Fwu-Iuan Hshieh, Saratoga, CA (US)

(73) Assignee: Magepower Semiconductor Corp., San Jose, CA (US)

( * ) Notice: Subject to any disclaimer, the term of this patent is extended or adjusted under 35 U.S.C. 154(b) by 0 days.

(21) Appl. No.: 09/655,165

(22) Filed: Sep. 5, 2000

Related U.S. Application Data

(62) Division of application No. 08/982,848, filed on Dec. 2, 1997.

(51) Int. Cl.$^7$ .............................................. H01L 21/336
(52) U.S. Cl. ...................... 438/270; 438/289; 438/589
(58) Field of Search ................................ 438/138, 212, 438/268, 270, 289, 290, 589

(56) References Cited

U.S. PATENT DOCUMENTS

| | | | |
|---|---|---|---|
| 5,016,066 A | * | 5/1991 | Takahashi |
| 5,168,331 A | * | 12/1992 | Yilmaz |
| 5,545,908 A | * | 8/1996 | Tokura et al. |
| 6,025,233 A | * | 2/2000 | Teresawa ..................... 438/270 |
| 6,100,140 A | * | 8/2000 | Okabe et al. ................ 438/270 |

FOREIGN PATENT DOCUMENTS

EP 0494597 * 7/1992

* cited by examiner

Primary Examiner—Chandra Chaudhari
(74) Attorney, Agent, or Firm—Bo-In Lin

(57) ABSTRACT

The preset invention discloses an improved method for fabricating a MOSFET transistor on a substrate to improve the device ruggedness. The fabrication method includes the steps of: (a) forming an epi-layer of a first conductivity type as a drain region on the substrate and then growing an gate oxide layer over the epi-layer; (b) depositing an overlaying polysilicon layer thereon and applying a polysilicon mask for etching the polysilicon layer to define a plurality of polysilicon gates; (c) removing the polysilicon mask and then carrying out a body implant of a second conductivity type followed by performing a body diffusion for forming a plurality of body regions; (d) performing a high-energy body-conductivity-type-dopant implant, eg., boron implant, to form a plurality of shallow low-concentration regions of source-conductivity-type, e.g., n-regions, under each of e gates. A DMOS power device with improved switching speed is provided with reduced gate-to-drain capacitance without causing an increase in either the on-resistance of the threshold voltage.

21 Claims, 11 Drawing Sheets

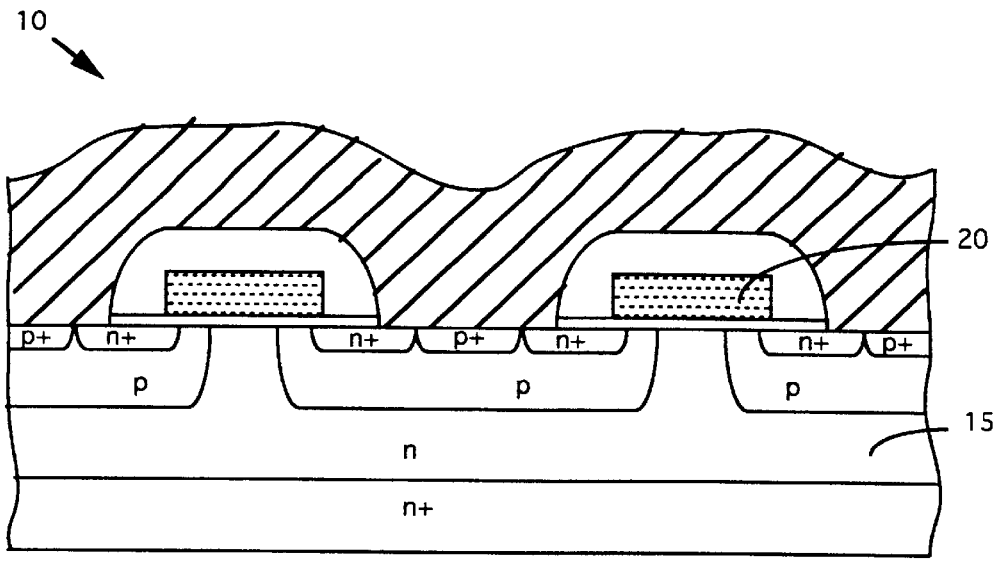
FIG. 1A (Prior Art)
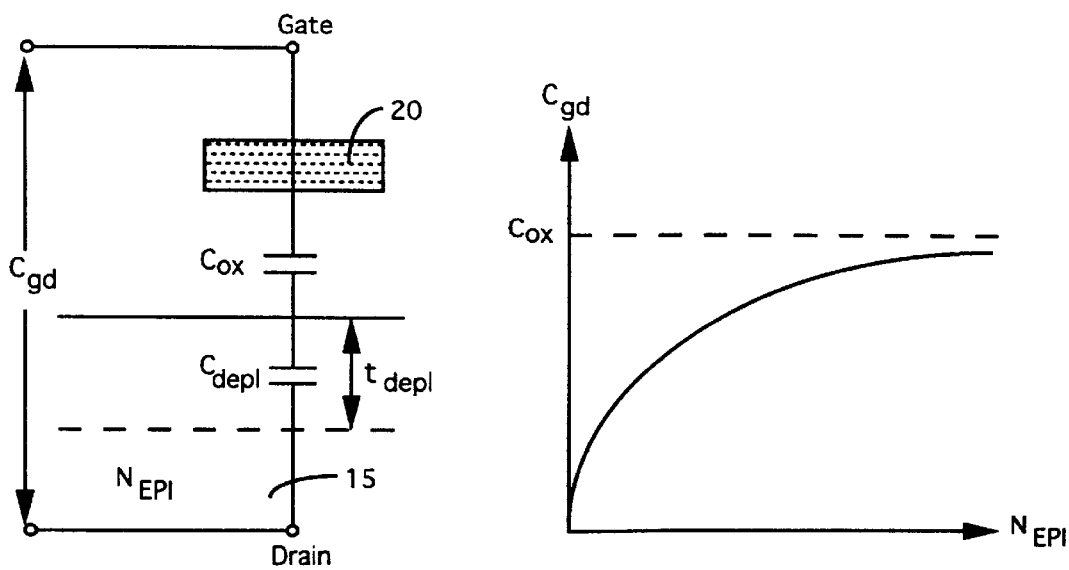
FIG. 1B (Prior Art)
FIG. 1C (Prior Art)

SWITCHING SPEED IMPROVEMENT IN DMO BY IMPLANTING LIGHTLY DOPED REGION UNDER GATE

This is a Divisional Patent Application of a co-pending application Ser. No. 08/982,848 filed on Dec. 2, 1997 by the same Applicants.

BACKGROUND OF THE INVENTION

1. Field of the Invention

This invention relates generally to the cell structure and fabrication process of vertical power transistors. More particularly, this invention relates to switching speed improvement achieved by carrying out a high-energy body-conductivity-type-dopant implant, e.g., boron implant through the gate. The high-energy body-conductivity-type-dopant implant forms a reduced doping concentration zone, e.g., an n zone, under the gate that serves to reduce the gate-to-drain capacitance of a vertical DMOS planar device. Thus, the device switching speed is improved with the reduced gate-to-drain capacitance without significantly increasing the on-resistance.

2. Description of the Prior Art

Improvement of the switching speed of a low-voltage DMOS power device cannot be conveniently achieved for the reason that the epitaxial layer is formed to have a low resistivity. A low resitivity is of course a desirable design feature for the low voltage device as a typical prior art device 10 shown in FIG. 1. However, an epitaxial layer 15 with a low resistivity as shown often causes a high capacitance between the gate 20 and the drain 15. As will be further described below, the switching speed of the DMOS device 10 is adversely affected by a high gate-to-drain capacitance.

FIG. 1B is an equivalent circuit diagram of the parasitic capacitors between the gate 20 and the drain 15. There is a first parasitic capacitor $C_{ox}$ formed over the gate oxide, which is connected in series to a second parasitic capacitor $C_{depl}$ formed over a depletion layer underneath the gate oxide layer. The gate-to-drain capacitance as a total capacitance over these two parasitic capacitors is:

$$Cgd=(C_{ox}C_{depl})/[C_{ox}+C_{depl}] \quad (1)$$

Where the capacitance of the parasitic capacitor over a depletion layer is inversely proportional the thickness of the depletion layer $t_{depl}$ where a positive bias voltage is applied between drain and gate.

$$C_{depl}=K/t_{depl} \quad (2)$$

Where K is a constant. The thickness of the depletion layer $t_{depl}$ is inversely proportional to the square root of the dopant concentration, therefore:

$$C_{depl}=K(N_{epi})^{1/2} \quad (3)$$

Where $N_{epi}$ represents the dopant concentration of the source epitaxial region 15. It can be derived from Equations (3) that by reducing the dopant concentration of the epitaxial layer, i.e., $N_{epi}$ the capacitance over the depletion layer $C_{epi}$ is reduced. And, from Equation (2), it is also clear that the gate-to-drain capacitance $C_{GD}$ is also reduced. A relationship between the capacitance $C_{GD}$ and that of the $N_{epi}$ is shown in FIG. 1C. A technique to improve the device switching speed is to reduce the dopant concentration in the $N_{epi}$ layer. However, a lower dopant concentration under the gate often causes the on-resistance to increase. Also, if the profile of the doping concentration in the epitaxial layer is not precisely controlled, it may also cause the threshold voltage to increase. For these reasons, improvement of switching speed cannot easily be accomplished by simply lowering the dopant concentration in the depletion layer. As will be further discussed below, the difficulties are due to the lack of control in depth and width of this low dopant concentration region. Improvements in device switching speed are often provided, in several of prior art device as described below, by degrading other performance characteristics.

In U.S. Pat. No. 5,016,066, entitled "Vertical Power MOSFET having High Withstand Voltage and High Switching Speed"; Takahashi disclosed a vertical field effect transistor as that shown in FIG. 2 The transistor includes a source electrode and a gate on the front surface of a semi-conductor substrate. The substrate has a first conductivity type and an electrode on the back surface of the substrate. The semiconductor device of has the structure wherein a connection region 3a of the first conductivity type positioned between two channel-forming base regions 4 of a second and opposite conductivity type is formed by a semiconductor layer. The base regions 4 have a higher impurity concentration, eg., $p^+$, than the drain region of the first conductivity type, e.g., n–. The surface portion 3b of the connection region 3a is connected to the channel, which has a lower impurity concentration, e.g., $n^-$, than the connection region 3a, e.g., $n^+$. But the doping concentration is the same as the impurity concentration as the epitaxial layer as that shown in FIGS. 2B and 2C Since tis device is formed to have a structure to provide high withstand voltage, this device is useful for making MOSFET Power device operated at more than 500 volts. For a low voltage device operated below 12 to 60 volts, due to a requirement of low resistivity in the epitaxial layer, the device disclosed by Takahashi tend to have a problem of low switching speed. This is due to a structure that region 3b has a same low impurity concentration as the epitaxial layer. Therefore, the device is not practically useful for low voltage application.

In a Japanese Patent Application 54-132908, entitled "Insulated Gate Type Field Effect Transistor", a transistor field effect transistor is formed to decrease the concentration of an electric field and to increase the dielectric resistance. Referring to FIG. 3 where a gate oxide film is formed on a wall surface of a concave section made up to the drain region. A region that has extremely low concentration of dopant impurities, e.g., $n^-$ region 210, is formed in the drain region at a nose of the concave section. In FIG. 3, an N– region 202 functioning as a second drain region is grown on an N+ type semiconductor substrate 201 segregated as a first drain on. An N– type region 210 is formed under the groove section 205. The electric field is eased with this extremely low concentration N– region. The FET transistor is made to resist high voltage wherein the gate oxide layer is protected near the bottom of the groove. The field effect transistor according to FIG. 3, however may not be practically useful for several reasons. An extremely low concentration region 210 can cause the on-resistance to increase and adversely impact the device performance. Furthermore, an implant operation to form these extremely low concentration regions 210 is not self-aligned. An effort to increase the cell density by reducing the size of the transistor cells is hindered. More lateral distance between cells has to be allowed to accommodate potential misalignment errors.

Therefore, there is still a need in the art of power device fabrication, particularly for power DMOS design and fabrication, to provide a simplified and improved fabrication process that would resolve these limitations. Specifically, a DMOS manufactured by this new method must provided reduced gate-to-drain capacitance to improved the switching speed. In the meantime, improvement of switching speed, provided by the novel device structure and manufacture method, should not be achieved at a price of degrading or sacrificing other design or performance characteristics.

SUMMARY OF THE PRESENT INVENTION

It is therefore an object of the present invention to provide a new and novel MOSFET cell structure, and fabrication process to form a MOSFET device with reduced gate-to-drain capacitance. Reduction of capacitance of the MOSFET device is accomplished without significantly increasing the on-resistance or the threshold voltage whereby the afore-mentioned limitations encountered in the prior art can be overcome.

Specifically, it is an object of the present invention to provide a new and improved MOSFET manufacture process and cell structure by performing a high energy body-conductivity-type dopant implant, e.g., boron implant, through the gate layer to form a shallow low-doping concentration region, e.g., an $n^-$ region, under the gate. The gate-to-drain capacitance is reduced with reduced doping concentration in the depletion layer under the gate. The switching speed of the device is improved.

Another object of the present invention is to provide a new and improved MOSFET manufacture process and cell structure by performing a high energy body-conductivity-type dopant implant, e.g., boron implant, through the gate layer. A shallow low-concentration region of a source-conductivity-type, e.g., an $n^-$ region, is formed with controllable precision A precisely controllable high-energy implant process can be performed without unduly increasing the on-resistance or the threshold voltage in forming this very shallow low doping concentration region.

Another object of the present invention is to provide a new and improved MOSFET manufacture process and cell structure by performing a high energy body-conductivity-type-dopant implant, e.g., a boron implant through the gate layer. A plurality of shallow low-doping concentration region, e g., $n^-$ regions, are formed after the body diffusion process. The shallow lightly doped region formed in the depletion layer under the gate is prevented from dopant redistribution caused by a long and high temperature body-diffusion process. The dopant profile is more precisely controllable to prevent performance degradation resulting from dopant redistribution due to diffusions.

Another object of the present invention is to provide a new and improved MOSFET manufacture process and cell structure by performing a low-energy light-dose body-dopant implant, e.g., boron implant, via trench openings after a body-diffusion. A plurality of shallow-and-narrow lightly doped source-conductivity-type-dopant regions, e.g., $n^-$ regions, are formed under the trenched gates. The shallow-and-narrow lightly doped region formed under the trenched gate is prevented from dopant redistribution caused by a long and high temperature body-diffusion process. The dopant profile is more precisely controllable to improve the switching speed and to prevent performance degradation resulting from dopant redistribution due to diffusions.

Briefly, in a preferred embodiment the present invention discloses an improved method for fabricating a MOSFET transistor on a substrate to improve the device ruggedness. The fabrication method includes the steps of: (a) forming an epi-layer of a first conductivity type as a drain region on the substrate and then growing an gate oxide layer over the epi-layer; (b) depositing an overlaying polysilicon layer thereon and applying a polysilicon mask for etching the polysilicon layer to define a plurality of polysilicon gates; (c) removing the polysilicon mask and then carrying out a body implant of a second conductivity type followed by performing a body diffusion for forming a plurality of body regions; (d) performing a high-energy body-conductivity-type-dopant implant, e.g., boron implant, to form a plurality of shallow low-concentration regions of source-conductivity-type, e.g., $n^-$ regions, under each of the gates; (e) applying a source blocking mask for implanting a plurality of source regions in the body regions with ions of the first conductivity type followed by removing the source blocking mask; (e) forming an overlying insulation layer covering the MOSFET device followed by applying a contact mask to open a plurality of contact openings there-through; and (f) performing a low energy body-dopant implant to form a shallow high-concentration second-conductivity-type dopant region followed by applying a high temperature process for densification of the insulation layer and for activating a diffusion of the shallow high-concentration second-conductivity-type dopant regions. A DMOS power device with improved switching speed is provided with reduced gate-to-drain capacitance without causing an increase in either the on-resistance of the threshold voltage.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1 is a cross-sectional view of a prior art structure of a general DMOS power device;

FIG. 1B is an equivalent circuit diagram of a general MOSFET device with parasitic capacitors;

FIG. 1C is a diagram showing the gate-to-drain capacitance as a function of the impurity concentration of the epitaxial layer;

FIGS. 2B and 2C are diagrams for illustrating the lateral and vertical dopant net-concentration profiles of a high voltage MOSFET device as that shown in FIG. 2A;

DETAILED DESCRIPTION OF THE PREFERRED EMBODIMENT

Figure 2A:
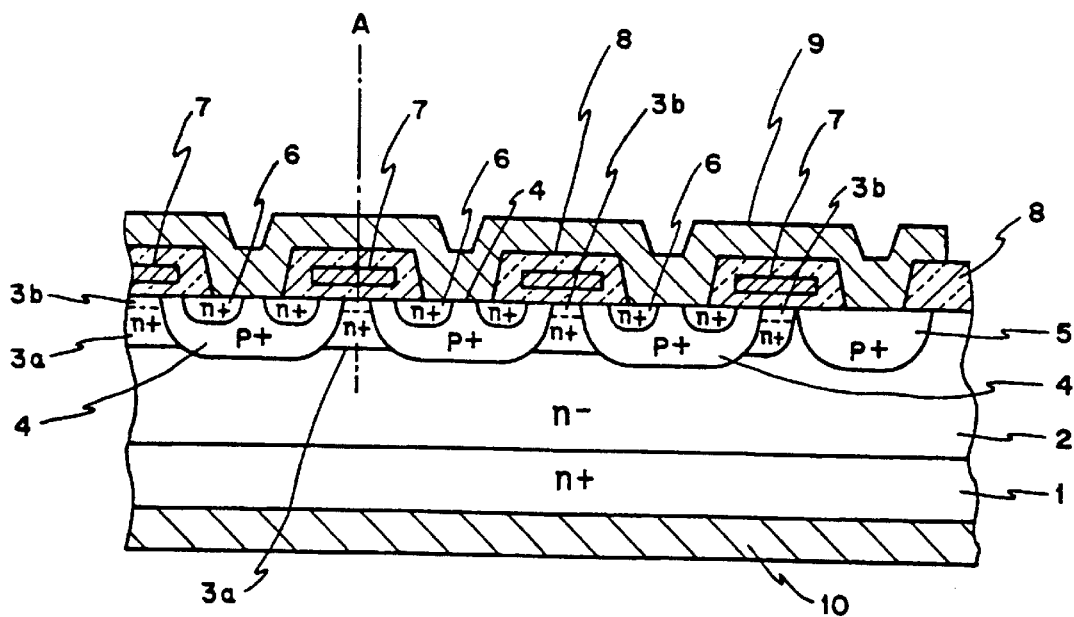
FIGS. 2A is a cross-sectional view of another prior art MOSFET structure with a heavy doped $n^+$ region formed with a lightly doped region n– near the surface between two channel-forming base regions for high voltage MOSFET power device.
Figure 2B:
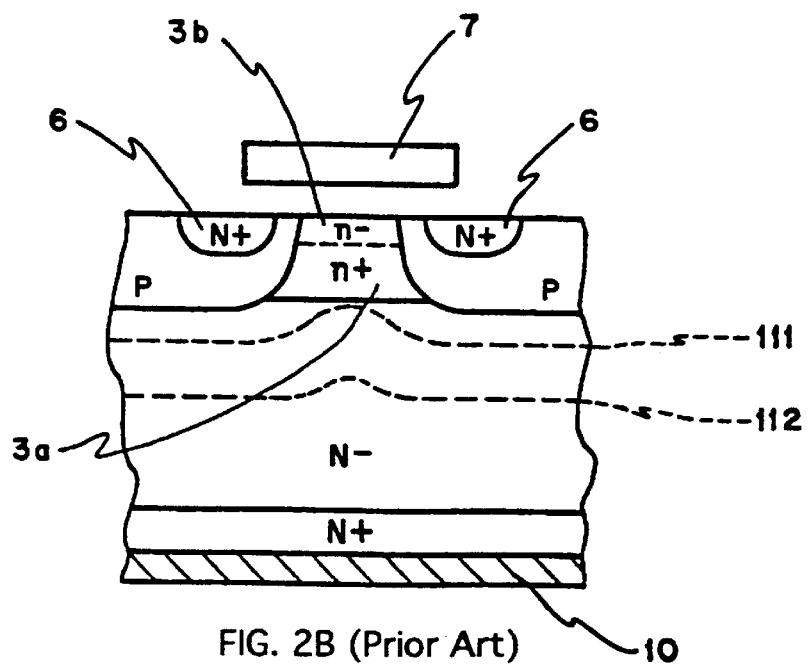
FIG. 2B shows the variation of the net dopant concentration as a function of the depth along a line F–F' of the MOSFET of FIG. 2A.
Figure 2C:
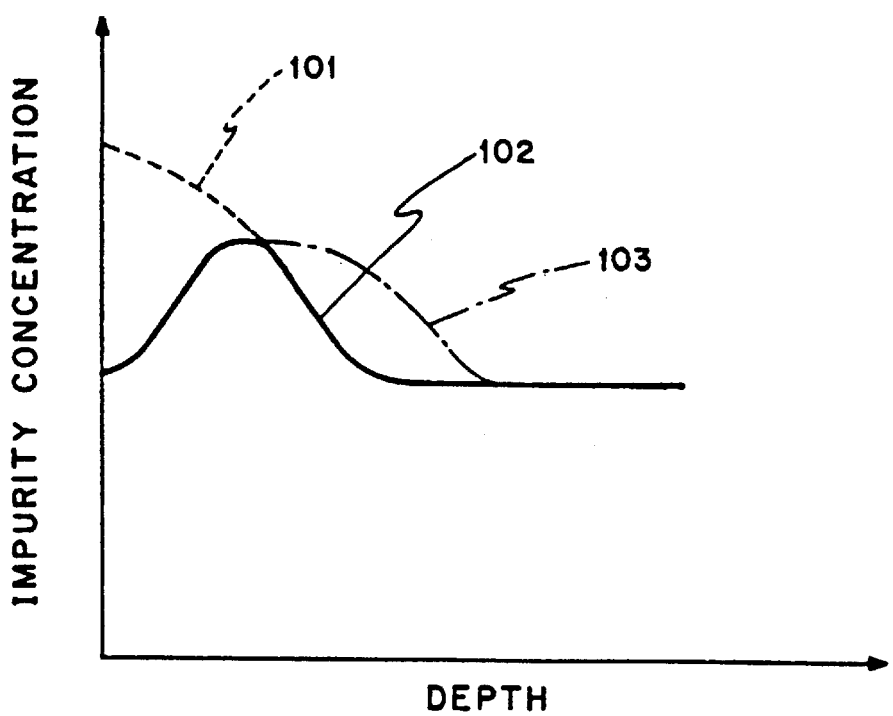
Figure 3:
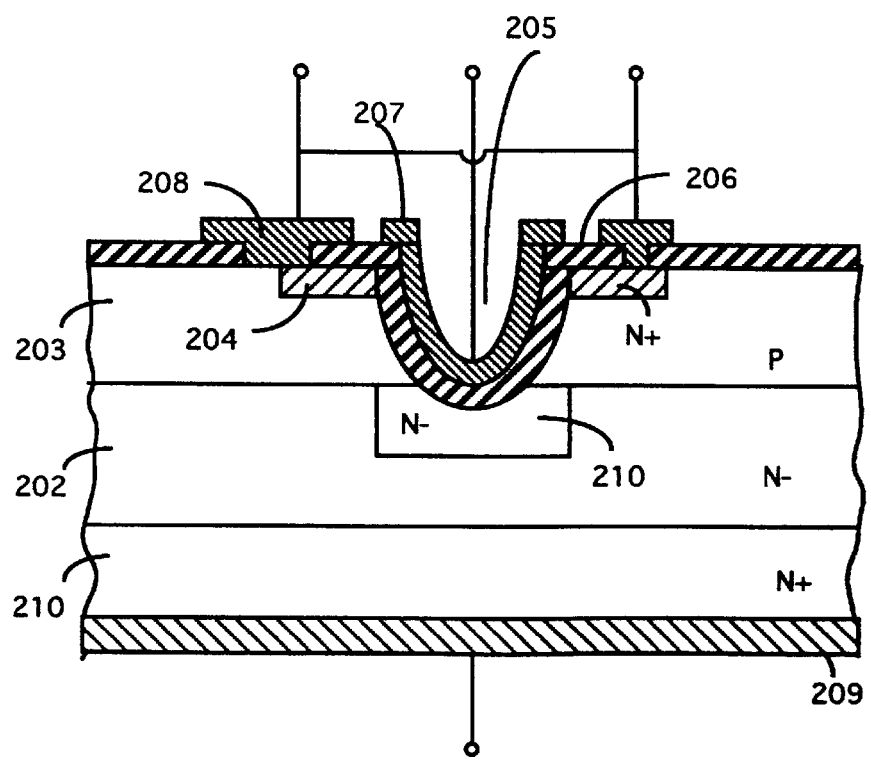
FIG. 3 is a cross sectional view of another field effect device with extremely low concentration regions under the trenched gate to protect the gate oxide near the bottom of the trenches.
Figure 4A:
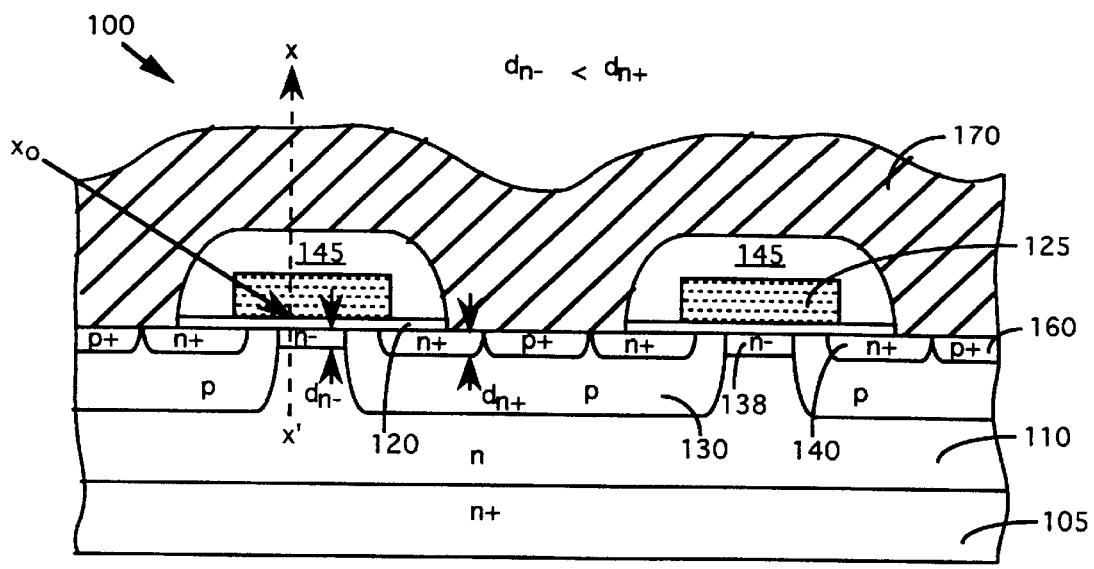
FIGS. 4A is a cross sectional view of a DMOS device of the present invention.
Figure 4B:
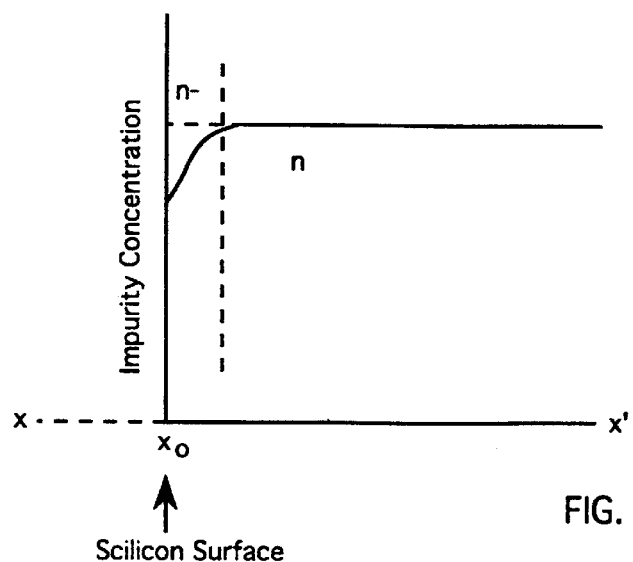
FIG. 4B is a diagram for illustrating the variation of the impurity concentration along the depth of an epitaxial layer supported on a semiconductor device.

Please refer to FIGS. 4A and 4B for a preferred embodiment of a DMOS power device 100 of the present invention. The DMOS device 100 includes a plurality of transistor cells formed in a semiconductor substrate 105 with a drain region of a first conductivity type, e.g., a n-type, formed at a bottom surface of the substrate 105. Each of these DMOS transistor cells includes a polysilicon segment constituting a gate 125 supported on a top surface of the substrate. The gate 125 is disposed substantially in a center portion of the transistor cell. The DMOS transistor cell further includes a source region of the first conductivity type, e.g., $n^+$ source region 140, in the substrate surrounding the edges of the gate with a portion extends underneath the gate. The DMOS transistor cell further includes a body region of a second conductivity type, e.g., a p-body region 130, in the substrate encompass the source region 140. The body region 130 also has a portion extends underneath the gate 125. The outer edges of the body region extend outwardly to the neighboring transistor cells, The body region 130 further includes a shallow high-concentration body-dopant region, e.g., a $p^+$ region 160, near the top surface of the substrate. The $p^+$ second-conductivity-type dopant region 160 is disposed near a boundary between two adjacent cells where a source contact opening is provided in an insulation layer 145 to allow a source contact metal segment 170 to contact the source regions 140. The shallow high-concentration $p^+$ regions 160 serve a special function of reducing the contact resistance between the metal segment 170 and the source regions 140. Particularly, the DMOS power device 100 includes a shallow low impurity concentration region of a first conductivity type eg, n– region 138, under the gate 125. The shallow low-impurity concentration region 138 has a depth, i.e., $d_{n-}$, shallower than the depth of the source region $d_{n+}$. therefore, $$d_{n-} < d_{n+} \quad (4)$$

By providing the shallow low-impurity concentration regions 138 of first conductivity type near the depletion layer under the gate 125, the capacitance $C_{depl}$ and the gate-to-drain capacitance $C_{GD}$ are reduced according to Equation (3) and FIG. 1C. In the meantime, since the depth of the shallow low-concentration first-conductivity-type regions 138 are precisely implanted with a very shallow depth and light dose, the on-resistance and the threshold voltage will not be increased. A dopant concentration along a line X–X' is shown in FIG. 4B. The source dopant concentration in the shallow low-impurity concentration region 138 of first conductivity type is lower than the normal source dopant concentration. The gate-to-drain capacitance is reduced and the switching speed of the DMOS device 100 is improved.

The advantages of the present invention are achieved by applying a high-energy body-conductivity-type-dopant implant through the gate layer 125. The energy level and the implanting dose of high-energy body-conductivity-type dopant implant can be precisely controlled. By precisely controlling these implant parameters, the dopant concentration and the depth of the implanted regions 138 can also be precisely controlled. Degradation of performance characteristics can be prevented by carefully-controlling the dopant profile and the depth of the shallow low-impurity-concentration first-conductivity-type regions 138.

Figure 5:
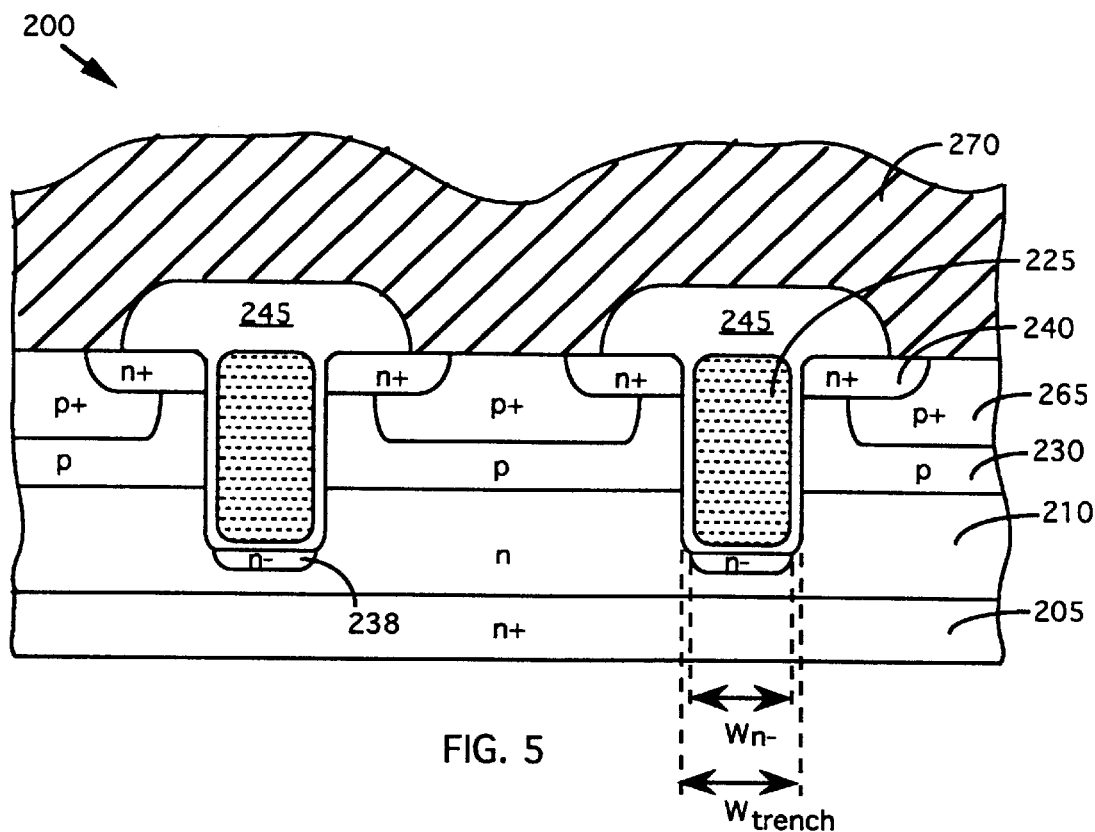
FIGS. 5 is a cross sectional view of a trench DMOS device of the present invention.

Referring to FIG. 5A for a trench DMOS power device 200 as an alternate preferred embodiment of the present invention. The trench DMOS transistor cell is formed in a semiconductor substrate 105 with a drain region of a first conductivity type formed at a bottom surface. The trench DMOS device includes a plurality of transistor cells. Each of these cells includes a polysilicon gate 225 disposed in a trench. The gate 225 in the trench is disposed substantially in a center portion of the cell. The DMOS transistor further includes a source region 240 of the first conductivity type, e.g., a $n^+$ source, surrounding the gate 225 near a top surface of the substrate. The trench DMOS transistor cell further includes a body region of a second conductivity type, e.g., a p-body region 230. The body region 230 encompasses the source regions 240 and surrounding the gate 225. The body region 230 extends outwardly to neighboring transistor cells. The body region 230 further includes a deep high-concentration body-dopant region, e.g., a $p^+$ region 265, below the source regions 240 in the epitaxial layer 210. The $p^+$ second-conductivity-type doped region 265 is disposed near a boundary between two adjacent cells where a source contact opening is provided in an insulation layer 245 to allow a source contact metal segment 270 to contact the source regions 240. The deep high-concentration $p^+$ regions 265 serve a special function of reducing the body region resistance and the contact resistance between the metal segment 270 and the source regions 240. The device ruggedness is improved with reduced body resistance. Particularly, the DMOS power device 200 includes a shallow-and-narrow low-concentration source-conductivity-type-dopant region, e.g., n– region 238, under the trenched gate 225. The shallow-and-narrow low-concentration source-conductivity-type-dopant region 238 has a shallow depth, i.e., $d_{n-}$, shallower than the depth of the source region $d_{n+}$. Furthermore, the shallow-and-narrow low concentration first-conductivity-type regions 238 has a narrow width $W_{n-}$ which is less than or equal to the width of the trench $W_{trench}$:

$$W_{n-} < W_{trench} \quad (5)$$

Again, the net dopaing concentration along the line X0 to X' is similar to that shown in FIG. 4B. Therefore, the shallow-narrow low-concentration first conductivity-type regions 238 reduced the gate-to-drain capacitance and improving the switching speed of the DMOS power device 200.

Figure 6A:
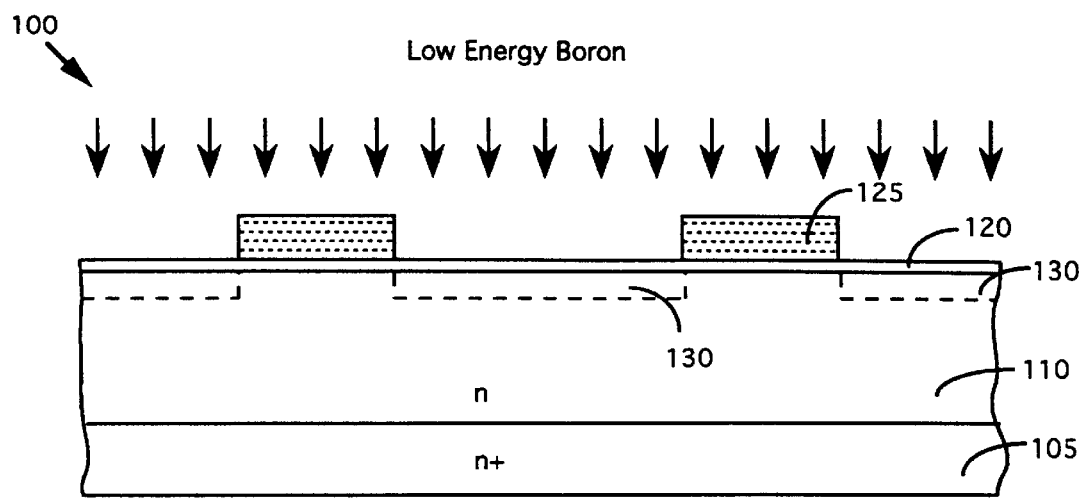
FIGS. 6A to 6H are a series of cross sectional views for illustrating the processing steps to manufacture a DMOS device of this invention.
Figure 6B:
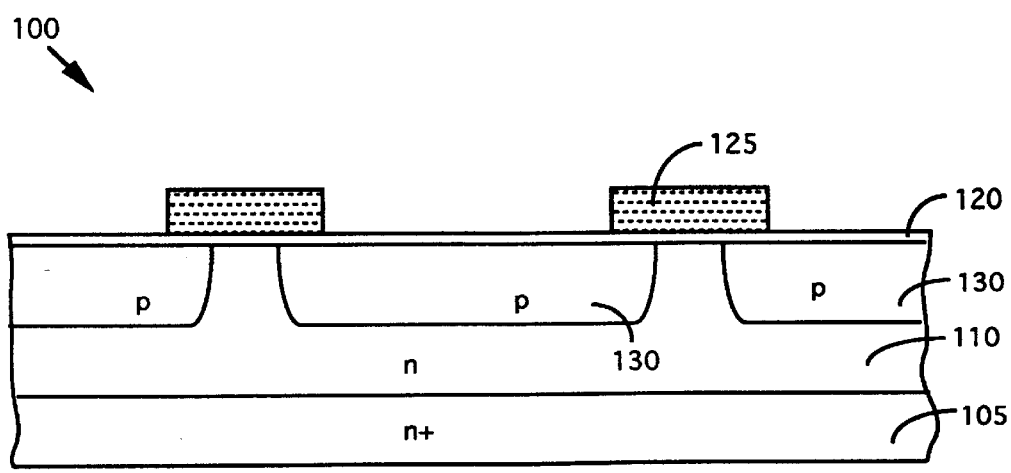

Referring to FIGS. 6A to 6H for the processing steps employed to manufacture the MOSFET device of the present invention. The process begins by first growing a N epitaxial layer 110 with a resistivity ranging from 0.1 to 1.0 ohm-cm on top of a $N^+$ substrate 105. The substrate has a resistivity of 0.001 to 0.007 ohm-cm. The thickness and the resistivity of the epitaxial layer 110 depend on the requirements for device on-resistance and breakdown voltage. In a preferred embodiment the thickness of the epi-layer 110 is about six to eight microns (6–8 μm). A gate oxidation process is first carried out to form a gate oxide layer 120. A polysilicon layer 125 is then deposited on the gate oxide layer 120. A $POCL_3$ doping process is carried out It is followed by an arsenic (As) implant process with an ion beam of energy at 60–80 Kev with a flux density of 5 to $8 \times 10^{15}/cm^2$ A polysilicon mask is then applied to carry out the an anisotropic etching process to define the polysilicon gate 125. The resist is stripped and a p-body implant at 30–100 Kev with an ion beam of $3\times10^{13}$ to $3\times10^{14}/cm^2$ flux density to form the p-body region 130. In FIG. 6B, a body diffusion process is then carried out at an elevated temperature of 1,000–1,200° C. for ten minutes to thee hours to increase the depth of the p-body region 135 to 1.0–20 μm.

Figure 6C:
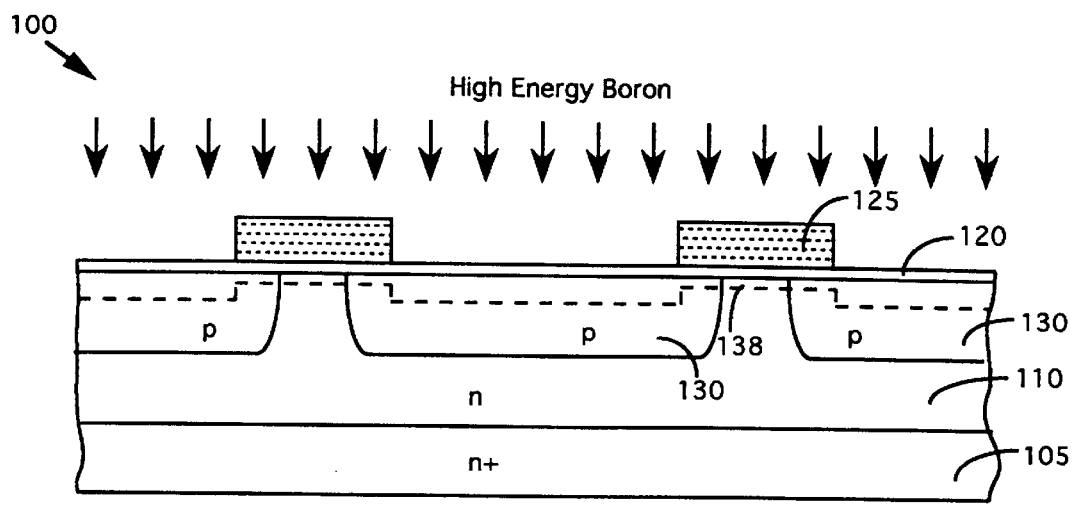

Referring to FIG. 6C, a high energy second-conductivity-type-dopant implant with a high energy ion beam of boron 132 at energy of about 200 to 400 Kev and ion flux density of $3\times10^{11}$ to $3-10^{12}/cm^2$ is carried out. A plurality of gate-to-drain capacitance, i.e., $C_{GD}$, reduction zones 138 are implanted with light-dose high-energy body-conductivity-type dopant, e.g., p-type ions, such that the n-type dopant concentrations in these zones are reduced. The reduced dopant concentration in these zones 138 underneath the gate 125 provides an advantage that gate-to-drain capacitance, i.e., $C_{GD}$, is reduced. These $C_{GD}$ capacitance reduction zones 138 are formed under the gates 125 with a depth less than the junction depth of the source region 140 that is typically less than 0.4 micrometers. Because the depth of these capacitance-reduction zones 138 is less than the junction depth of the source regions 140, the reduced n-type dopant concentration in these zones will not cause the on-resistance to increase. Also, because of the shallow depth of these zones, the reduced n-type dopant concentrations underneath the gates 125 would not adversely increase the threshold voltage.

Figure 6D:
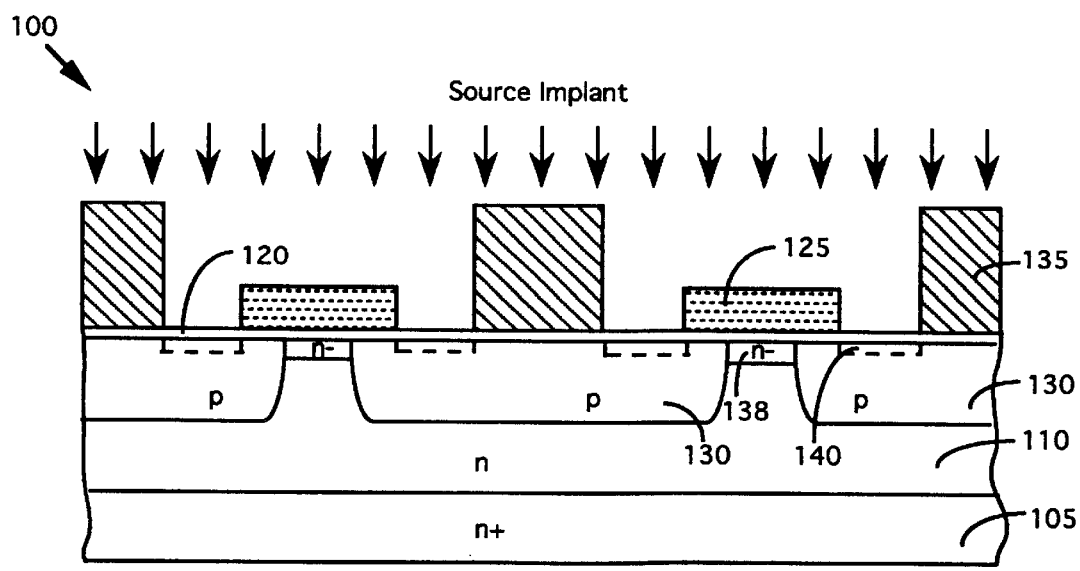
Figure 6E:
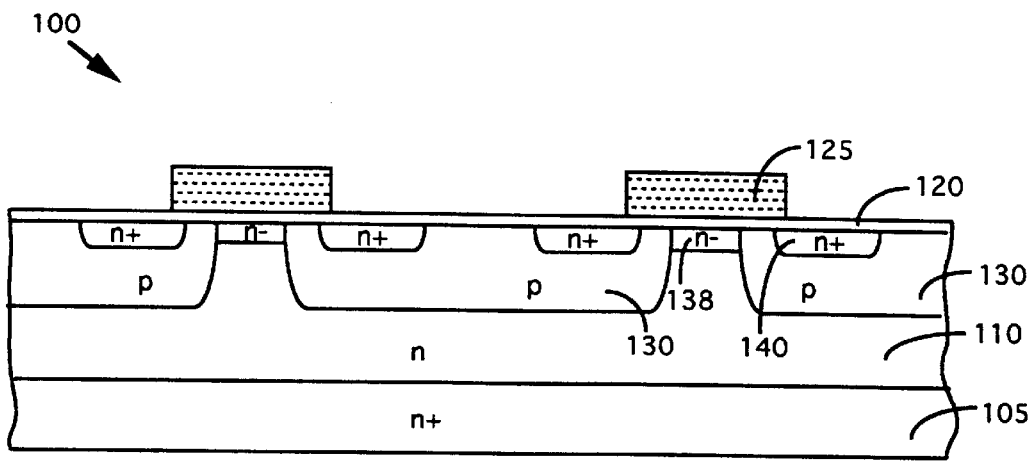
Figure 6F:
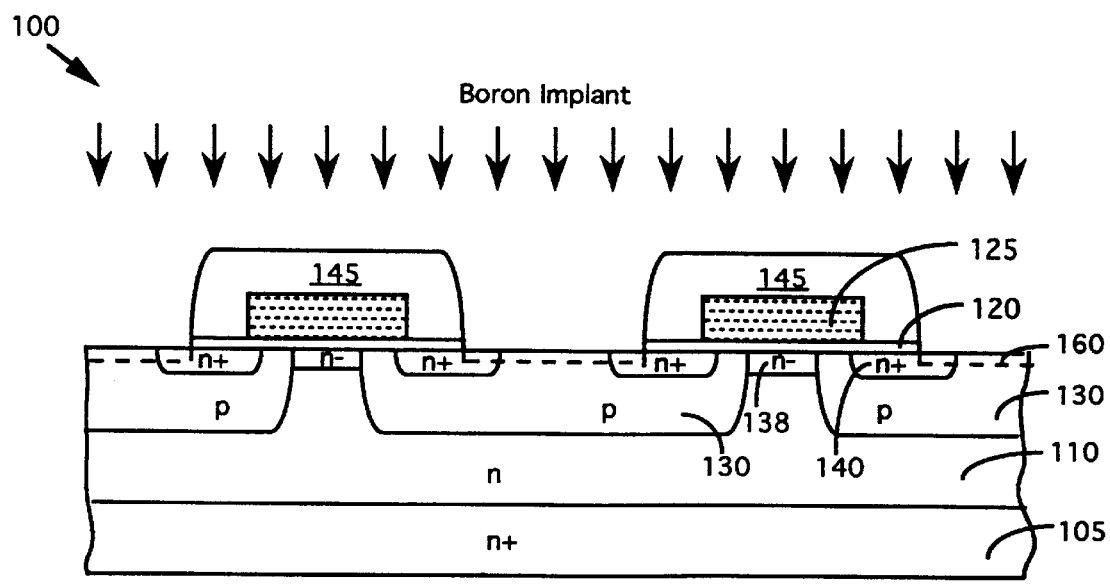
Figure 6G:
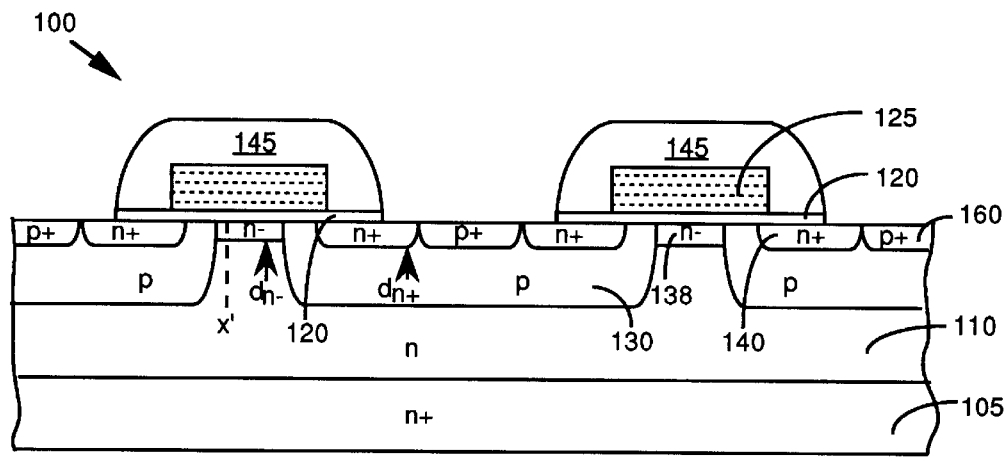
Figure 6H:
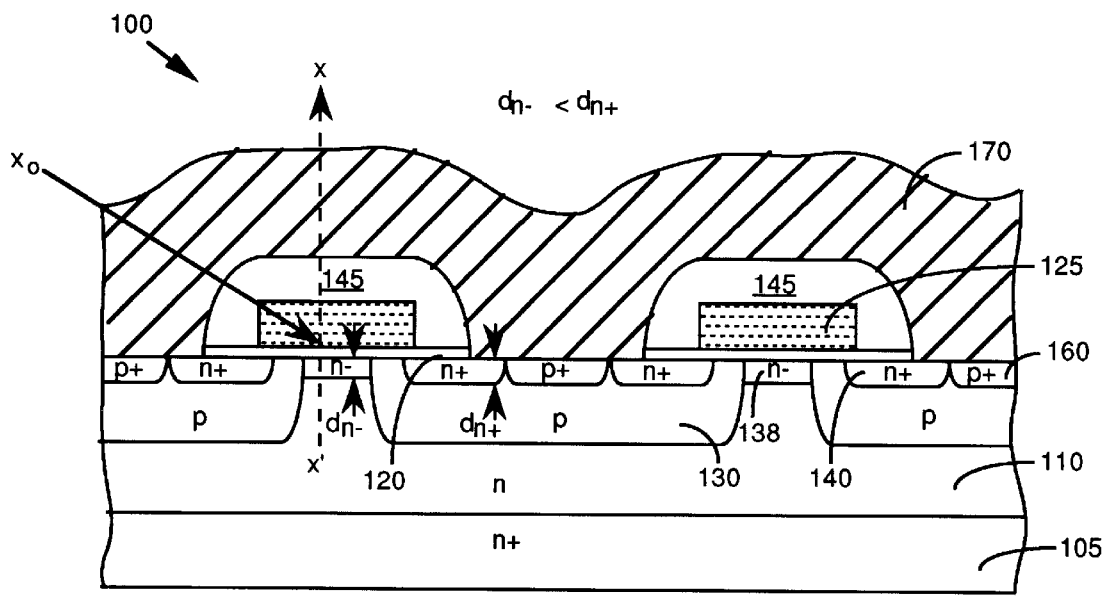

Referring to FIG. 6D, a source-blocking mask 135 is applied to carry out an N⁺ implant to form the N⁺ region 140. The N⁺ implantation is carried out with an ion beam at an energy of 60–100 Kev and ion flux density of $5\times10^{15}$ to $1\times10^{16}/cm^2$. In FIG. 6E., after the resist is stripped the N⁺ source regions 140 are driven into desired junction depth ranging from 0.2 to 1.0 μ by a diffusion process. Referring to FIG. 6F, a BSG or BPSG layer is deposited to form an overlying insulation layer 145 of about 5,000 to 15,000 Å in thickness. A contact mask is applied to perform an etching process to define a plurality of contact windows 150. Implantation of a boron ion-beam 155 is carried out to form a shallow high concentration body region 160. The boron implanted is performed with either a low energy boron implant with an ion flux of $1\times10^{14}$ to $2\times10^{15}/cm^2$ at about 20 to 60 Kev or a high energy $BF_2$ implant with an ion flux of $1\times10^{14}/cm^2$ to $2\times10^{15}$ at about 100–240 Kev. Referring to FIG. 6G, a BPSG reflow and densification process is performed at 900–950° C. for thirty minutes to one hour. The shallow body regions 160 are activated. In FIG. 6H, a metal layer 170 is then deposited over the insulation layer 145. The metal layer 170 are then patterned to provide metal segments to serve the function as electric contact terminals.

Figure 7A:
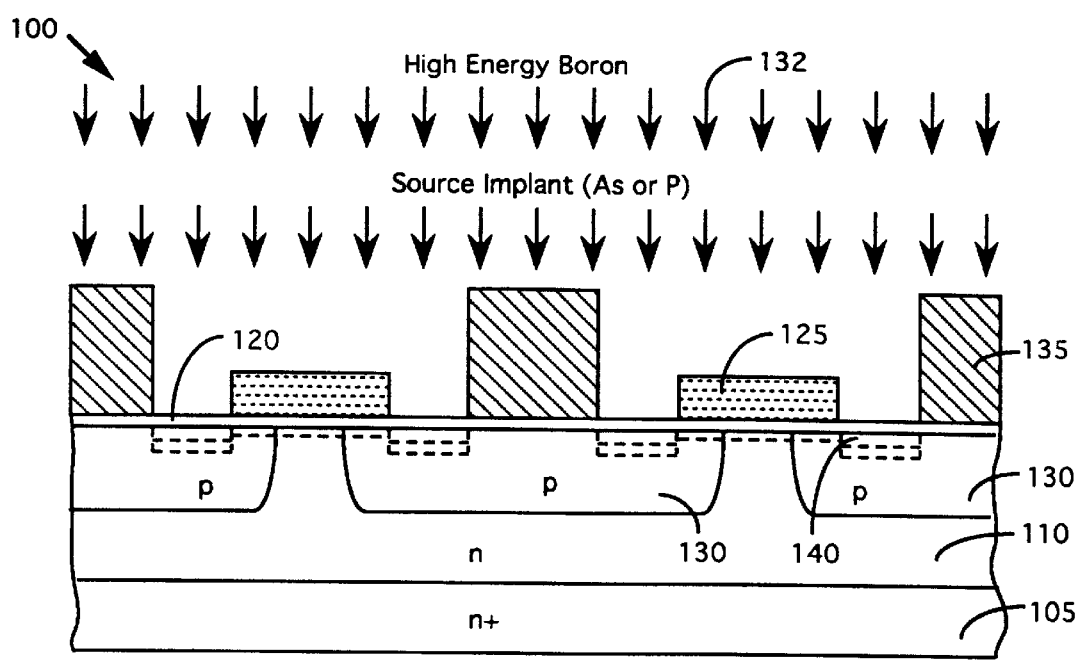
FIGS. 7A to 7C are a series of cross sectional views for illustrating an alternate method of FIGS. 6A to 6H to manufacture a DMOS device.
Figure 7B:
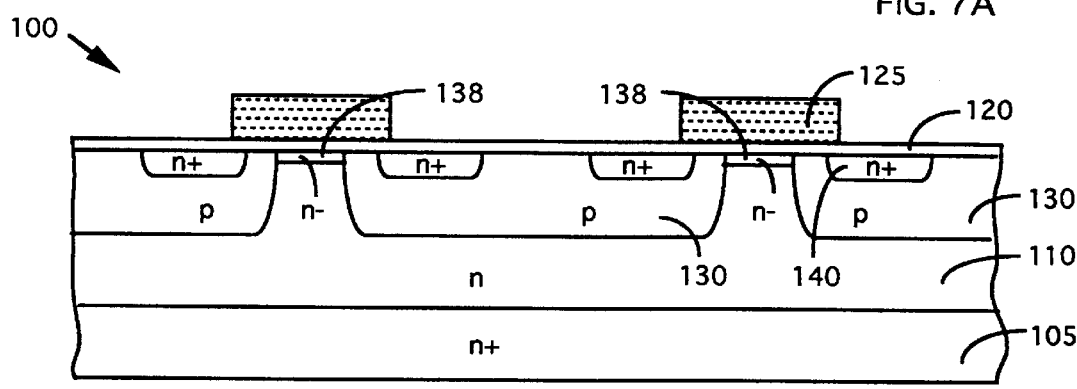
Figure 7C:
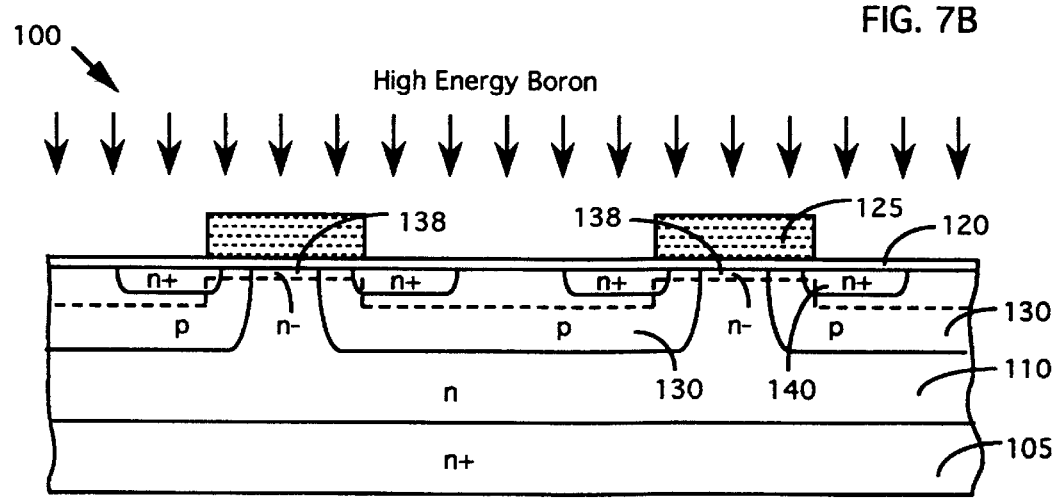

FIGS. 7A to 7C shows an alternate method for making an almost identical MOSFET device 100 as that shown in FIG. 4A of the present invention. The processes of growing a N epitaxial layer on top of a N⁺ substrate 105, and then forming a plurality of polysilicon gates 125 over a gate-oxide layer 120 on the top surface of the substrate are same as that described in FIGS. 6A. Body implant and body diffusion operations are performed same as that described in FIG. 6B. Then in FIG. 7A, a source-blocking mask 135 is applied to carry out an N⁺ implant to form the N⁺ region 140 The N⁺ implantation is carried out with an ion beam at an energy of 60–100 Kev and ion flux density of $5\times10^{15}$ to $1\times10^{16}/cm^2$. A high energy second-conductivity-type dopant with a high energy ion beam of boron 132 at energy of about 200 to 400 Kev and ion flux density of $3\times10^{11}$ to $3\times10^{12}/cm^2$ is carried out. A plurality of gate-to-drain capacitance, i.e., $C_{CD}$, reduction zones 138 are implanted with light-dose high-energy second-conductivity-type dopant, e.g., p-type ions, such that the n-type dopant concentrations in these zones are reduced. The reduced dopant concentration in these zones 138 underneath the gate 125 Provides an advantage that gate-to-drain capacitance, i.e., $C_{GD}$, is reduced. These $C_{GD}$ capacitance reduction zones 138 are formed under the gates 125 with a depth less than the junction depth of the source region 140 that is typically less than 0.4 micrometers. Because the depth of the capacitance reduction zones 138 is less than the junction depth of the source regions 140, the on-resistance will not significantly increase. Also because of the low dose, the reduced n-type dopant concentrations underneath the gate 125 would not adversely increase the threshold voltage. In FIG. 7B, after the source-blocking mask 135 is stripped, the N⁺ source regions 140 are driven into desired junction depth ranging from 0.2 to 1.0 μ by a diffusion process. The processing steps following the steps of FIG. 7B are identical to that shown in FIGS. 6E to 6H.

FIG. 7C shows an alternate embodiment where the high-energy boron implant is carry out after the formation of the source region 140. After the source blocking mask 135 is removed, a high energy second-conductivity-type dopant implant with a high energy ion beam of boron 132 at energy of about 200 to 400 Kev and ion flux density of $3\times10^{11}$ to $3\times10^{12}/cm^2$ is carry out. A plurality of gate-to-drain capacitance, i.e., $C_{GD}$ reduction zones 138 are implanted with light-dose high-energy second-conductivity-type dopant, eg, p-type ions, such that the n-type dopant concentrations in these zones are reduced. The reduced dopant concentration in these zones 138 underneath the gate 125 provides an advantage that gate-to-drain capacitance, i.e., $C_{GD}$ is reduced. Again, these capacitance-reduction zones 138 are formed with shallow depth such that the on-resistance and threshold-voltage are affected. the processing steps following the steps of FIG. 7C are identical to that shown in FIGS. 6E to 6H.

According to FIGS. 6A to 6H, this invention discloses a method for manufacturing a DMOS power device 100. The method includes the steps of: (a) forming an epitaxial-layer 110 of a first conductivity type on the substrate 105 functioning as a drain region, and then growing an gate oxide layer 120 over the epitaxial layer 110; (b) depositing an overlaying polysilicon layer thereon and applying a poly-silicon mask for etching the polysilicon layer to define a plurality of polysilicon gates 125; (c)removing the polysilicon mask and then carrying out a body implant of a second conductivity type followed by performing a body diffusion for forming a plurality of body regions 130; (d) performing a high-energy second-conductivity-type dopant implant to form a plurality of shallow low-concentration source-conductivity-type dopant regions 138 under each of the gates 125; (e) applying a source blocking mask 135 for implanting a plurality of source regions 140 in the body regions 130 with ions of the first conductivity type followed by removing the source blocking mask 135 and performing a source diffusion process; (e) forming an overlying insulation layer 145 covering the MOSFET device followed by applying a contact mask to open a plurality of contact openings there-through; and (f) performing a low energy body-conductivity-type dopant implant to form a shallow high-concentration second-conductivity-type doped region 160 followed by applying a high temperature process for densification of the insulation layer 145 and for activating a diffusion of the shallow high-concentration second-conductivity-type doped regions 160. A DMOS power device with improved switching speed is provided with reduced gate-to-drain capacitance without causing an increase in either the on-resistance of the threshold voltage.

According to FIGS. 7A and 7B, the processing steps to manufacture the DMOS device 100 are identical to that shown in FIGS. 6A to 6H except that the sequence of carrying out steps (d) and step (e) is reversed. A step (d) of applying a source blocking mask 135 for implanting a plurality of source regions 140 in the body regions 130 with ions of the first conductivity type is first carried out. Then followed by a step (e) of performing a high-energy second-conductivity-type dopant implant to form a plurality of shallow low-concentration source-conductivity-type regions 138 under each of the gates 125. Then, the source-blocking mask 135 is removed and a source diffusion process is performed.

Figure 8A:
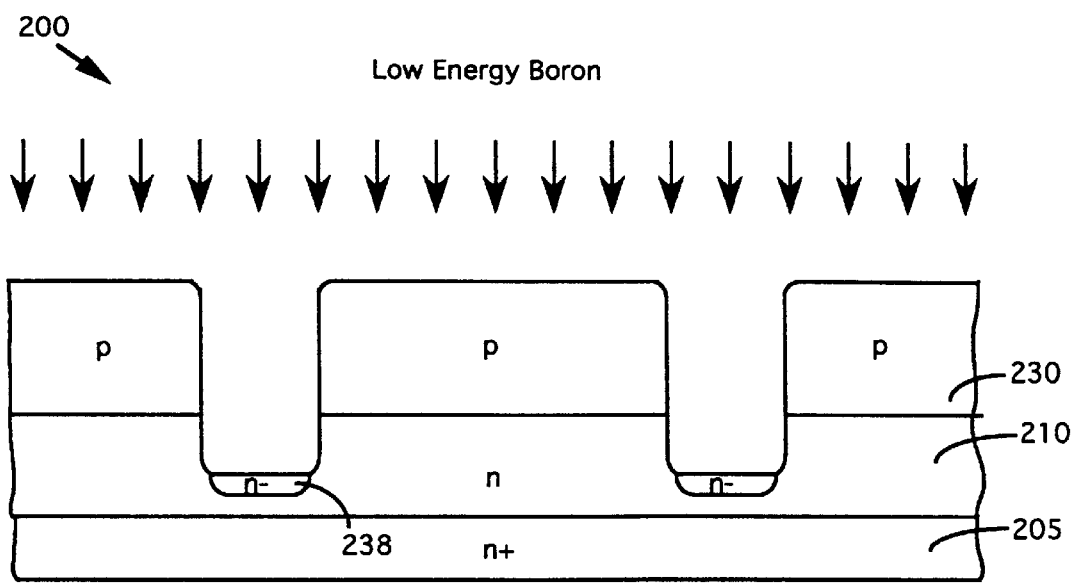
FIGS. 8A and 8B are cross sectional views of a trench DMOS device for illustrating the processing steps to manufacture an improved trench DMOS of this invention.
Figure 8B:
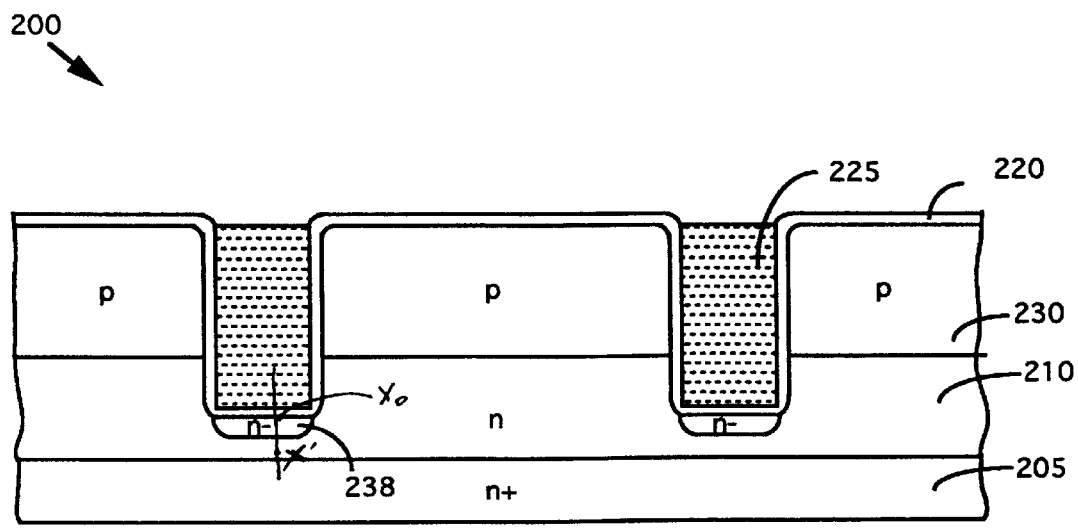

Referring to FIGS. 8A and 8B for two special processing steps employed for manufacturing a trench DMOS power device 200 of this invention. Several prior processing steps are performed to provide a semiconductor structure as that shown in FIG. 8A. The processing steps begins by first growing an epitaxial layer 210 on top of a substrate 205 and then performing a body implant followed by body diffusion to form the body regions 230. A trench mask is employed to open the trenches 235. Since these steps are well known in the art, no detail descriptions are necessary. As shown in FIG. 8A, a low energy body-conductivity-type dopant implant is performed with boron ions 237 at an energy level of 20 to 80 Kev and ion flux density of $3 \times 10^{11}$ to $3 \times 10^{12}/cm^2$. A plurality of shallow-and-narrow capacitance reduction zones 238 under the trenches 235 are formed. In FIG. 8B, a gate oxide layer 220 is grown and a polysilicon layer is deposited and removed from above the top surface of the substrate to form the trenched gates 225. By adjusting the energy of the implant ion beam 237, the depth of the shallow-and-narrow capacitance reduction zones 238 can be precisely controlled. Since the boron implant is performed via the trenches 235, the width of the low concentration source-dopant regions 238 is narrower than the trenches. With the shallow-and-narrow capacitance reduction zones 238 formed after the body diffusion, the dopant profiles of these regions will not be significantly broadened or deepened by further diffusion operations. The switching speed of the trench DMOS device 200 can therefore be improved by reducing the gate-to-drain capacitance without causing other degradations in device performance.

According to FIGS. 8A to 8B and above descriptions, this invention discloses a method for fabricating a trench DMOS transistor on a substrate 205. The method includes the steps of (a) forming an epi-layer 210 of a first conductivity-type in the substrate 205 with a bottom surface functioning as a drain; (b) performing a body implant of a second conductivity type followed by performing a body diffusion for forming a of body regions 130; (c) applying trench mask for etching a plurality of trenches 235 in the substrate; (d) implanting a body-conductivity-type dopant via the trenches 235 to form a plurality of shallow-and-narrow low-concentration source-conductivity-type regions 238 under each of the trenches 235; (e) depositing a polysilicon layer 225 to fill the trenches and etching and removing the polysilicon layer from above the top surface of the substrate to form a plurality of trenched gates 225; (f) applying a source blocking mask for implanting a plurality of source regions in the body regions with ions of the first conductivity type followed by removing the source blocking mask and a source diffusion process; (g) forming an overlying insulation layer covering the MOSFET device followed by applying a contact mask to open a plurality of contact openings therethrough; and (f) performing a high energy body-dopant to form a self-aligned deep high concentration second-conductivity-type doped region 265.

Therefore, the present invention provides a new and improved cell structure, and fabrication press to form a DMOS device with reduce gate-to-drain capacitance without increasing the on-resistance or the threshold voltage such that the limitations encountered in the prior art can be overcome. Specifically, a high-energy second-conductivity-type dopant implant through the gate layer is performed to form a shallow lightly doped source-dopant region under the gate. The gate-to-drain capacitance is reduced with reduced doping concentration in the depletion layer under the gate. The switching speed of the device is improved. A precisely controllable high-energy implant process is performed without unduly increasing the on-resistance or the threshold voltage in forming this very shallow low doping concentration region. The shallow lightly doped region formed in the depletion layer under the gate is prevented from dopant redistribution caused by a long and high temperature body diffusion process. The dopant profile is more precisely controllable to prevent performance degradation resulting from dopant redistribution due to diffusions. Furthermore, a new and improved MOSFET manufacture process and cell structure is provided by performing a low-energy high-dose second-conductivity-type dopant implant via trench openings after a body diffusion. A plurality of shallow-and-narrow lightly doped source-dopant regions is formed under the trenched gates. The shallow-and-narrow lightly doped region formed in the depletion layer under the trenched gate is prevented from dopant redistribution caused by a long and high temperature body-diffusion process. The dopant profile under the trenched gate is more precisely controllable to improve the switching speed and to prevent performance degradation resulting from dopant redistribution due to diffusions.

Although the present invention has been described in terms of the presently preferred embodiment it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating a DMOS transistor on a substrate comprising:
   (a) forming an epitaxial-layer of a first conductivity type on said substrate functioning as a drain region, and then growing an gate oxide layer over said epitaxial layer;
   (b) depositing an overlaying polysilicon layer and applying a polysilicon mask for etching said polysilicon layer to define a plurality of polysilicon gates;
   (c) removing said polysilicon mask and then carrying out a body implant of a second conductivity type followed by performing a body diffusion for forming a plurality of body regions; and
   (d) performing a high-energy light-dose body-conductivity-type dopant implant through said polysilicon gate to form a plurality of shallow low-concentration first-conductivity-type regions under each of said gates having a lower dopant concentration of said first conductivity type than said epitaxial layer.

2. The method for fabricating said DMOS transistor of claim 1 further comprising:
   (e) applying a source blocking mask for implanting a plurality of source regions in said body regions with ions of said first conductivity type followed by removing said source blocking mask and performing a source diffusion process; and (f) forming an overlying insulation layer covering said DMOS device followed by applying a contact mask to open a plurality of contact openings there-through.

3. The method for fabricating said DMOS transistor of claim 1 further comprising a step of:

(g) performing a low energy body-conductivity-type dopant implant to form a shallow high-concentration body-conductivity-type dopant region followed by applying a high temperature process for densification of said insulation layer and for activating a diffusion of said shallow high-concentration body-conductivity-type dopant regions.

4. The method for fabricating said MOSFET transistor of claim 1 wherein:

said step (d) is a step of applying a source blocking mask for implanting a plurality of source regions in said body regions with ions of said first conductivity type; and said step (e) is a step of performing a high-energy light-dose second-conductivity-type dopant implant to form a plurality of shallow low-concentration source-conductivity-type regions under each of said gates followed by removing said source-blocking mask and performing a source diffusion process.

5. The method for fabricating said MOSFET transistor of claim 1 wherein:

said step (d) of performing a high-energy light-dose body-conductivity-type dopant implant to form a plurality of shallow low-concentration source-conductivity-type regions under each of said gates is a step of forming said shallow low-concentration source-conductivity-type regions shallower than said source regions.

6. The method for fabricating said MOSFET transistor of claim 3 wherein:

said step (e) of performing a high-energy light-dose body-conductivity-type dopant implant to form a plurality of shallow low-concentration source-conductivity-type regions under each of said gates is a step of forming said shallow low-concentration source-conductivity-type regions shallower than said source regions.

7. The method for fabricating said MOSFET transistor of claim 1 wherein:

said step (d) of performing a high-energy light-dose body-conductivity-type dopant implant to form a plurality of shallow low-concentration source-conductivity-type regions under each of said gates is a step of implanting a plurality boron ions as second-conductivity-type dopant of said second conductivity type with an energy ranging from 200 to 400 Kev.

8. The method for fabricating said MOSFET transistor of claim 1 wherein:

said step (d) of performing a high-energy light-dose body-conductivity-type dopant implant to form a plurality of shallow low-concentration source-conductivity-type regions under each of said gates is a step of forming said shallow low-concentration source-conductivity-type regions with a depth less than 0.4 micrometers.

9. A method for fabricating a trench DMOS transistor on a substrate comprising steps of:

(a) forming an epi-layer of a first conductivity type in said substrate with a bottom surface functioning as a drain;

(b) performing a body implant of a second conductivity type followed by performing a body diffusion for forming a body regions;

(c) applying a trench mask for etching a plurality of trenches in said substrate;

(d) implanting a low-energy second-conductivity-type dopant through said trenches to form a plurality of shallow-and-narrow low-concentration first-conductivity-type regions under each of said trenches;

(e) depositing a polysilicon layer to fill said trenches and etching for removing said polysilicon layer from above said top surface of said substrate to form a plurality of trenched gates;

(f) applying a source blocking mask for implanting a plurality of source regions in said body regions with ions of said first conductivity type followed by removing said source blocking mask and carrying out a source diffusion process; and (g) forming an overlying insulation layer covering said DMOS device followed by applying a contact mask to open a plurality of contact openings there-through.

10. The method for fabricating said trench DMOS transistor of claim 9 further comprising a step:

(h) performing a high energy second-conductivity-type dopant implant to form a self-aligned deep high concentration second-conductivity-type dopant region below each of said source regions.

11. The method for fabricating said MOSFET transistor of claim 9 wherein:

said step (d) of forming said plurality of shallow-and-narrow low-concentration first-conductivity-type regions under each of said trenches is a step of forming said shallow-and-narrow low-concentration source-dopant regions with a region-width narrower than each of said trenches.

12. The method for fabricating said trench DMOS transistor of claim 9 wherein:

said step (d) of implanting said low-energy second-conductivity-type dopant through said trenches to form a plurality of shallow-and-narrow low-concentration first-conductivity-type regions under each of said trenches is a step of implanting a plurality boron ions as second-conductivity-type dopant with an energy ranging from 20 to 80 Kev.

13. The method for fabricating said MOSFET transistor of claim 9 wherein:

said step (d) of implanting said low-energy second-conductivity-type dopant through said trenches to form a plurality of shallow-and-narrow low-concentration first-conductivity-type regions under each of said trenches is a step of forming said shallow-and-narrow low-concentration source-dopant regions with a depth less than 0.4 micrometers below each of said trenches.

14. A method for fabricating a DMOS transistor on a substrate comprising:

a) forming an epitaxial-layer of a first conductivity type on said substrate functioning as a drain region, and then growing an gate oxide layer over said epitaxial layer;

b) depositing an overlaying polysilicon layer and applying a polysilicon mask for etching said polysilicon layer to define a plurality of polysilicon gates;

c) applying a source blocking mask for implanting a plurality of source regions in said body regions with ions of said first conductivity type; and d) performing a high-energy light-dose second-conductivity-type dopant implant to form a plurality of shallow low-concentration source-conductivity-type regions under each of said gates followed by removing said source-blocking mask and performing a source diffusion process.

15. The method for fabricating said DMOS transistor of claim 1 further comprising:
   e) forming an overlying insulation layer covering a top surface said DMOS device followed by applying a contact mask to open a plurality of contact openings there-through.

16. The method for fabricating said DMOS transistor of claim 15 further comprising a step of:
   f) performing a low energy body-conductivity-type dopant implant to form a shallow high-concentration body-conductivity-type dopant region followed by applying a high temperature process for densification of said insulation layer and for activating a diffusion of said shallow high-concentration body-conductivity-type dopant regions.

17. The method for fabricating said MOSFET transistor of claim 14 wherein:
   said step (c) is a step of removing said polysilicon mask and then carrying out a body implant of a second conductivity type followed by performing a body diffusion for forming a plurality of body regions; and
   said step (d) is a step of performing a high-energy light-dose body-conductivity-type dopant implant through said polysilicon gate to form a plurality of shallow low-concentration first-conductivity-type regions under each of said gates having a lower dopant concentration of said fist conductivity type than said epitaxial layer.

18. The method for fabricating said MOSFET transistor of claim 14 wherein:
   said step (e) of performing a high-energy light-dose body-conductivity-type dopant implant to form a plurality of shallow low-concentration source-conductivity-type regions under each of said gates is a step of forming said shallow low-concentration source-conductivity-type regions shallower than said source regions.

19. The method for fabricating said MOSFET transistor of claim 17 wherein:
   said step (d) of performing a high-energy light-dose body-conductivity-type dopant implant to form a plurality of shallow low-concentration source-conductivity-type regions under each of said gates is a step of forming said shallow low-concentration source-conductivity-type regions shallower than said source regions.

20. The method for fabricating said MOSFET transistor of claim 14 wherein:
   said step (d) of performing a high-energy light-dose body-conductivity-type dopant implant to form a plurality of shallow low-concentration source-conductivity-type regions under each of said gates is a step of implanting a plurality boron ions as second-conductivity-type dopant of said second conductivity type with an energy ranging from 200 to 400 Kev.

21. The method for fabricating said MOSFET transistor of claim 14 wherein:
   said step (d) of performing a high-energy light-dose body-conductivity-type dopant implant to form a plurality of shallow low-concentration source-conductivity-type regions under each of said gates is a step of forming said shallow low-concentration source-conductivity-type regions with a depth less than 0.4 micrometers.

* * * * *